(12) United States Patent
Hayashi

(10) Patent No.: US 6,861,455 B2
(45) Date of Patent: Mar. 1, 2005

(54) COMPOSITION FOR BULKHEAD OF THIN DISPLAY PANEL

(75) Inventor: Noriya Hayashi, Aichi-ken (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 393 days.

(21) Appl. No.: 09/774,096

(22) Filed: Jan. 31, 2001

(65) Prior Publication Data

US 2002/0004353 A1 Jan. 10, 2002

(30) Foreign Application Priority Data

Feb. 22, 2000 (JP) .......................................... 2000-044205

(51) Int. Cl.$^7$ ............................ C08J 3/28; C08G 65/26; C08K 3/18
(52) U.S. Cl. ............................ 522/25; 522/31; 522/81; 522/83; 522/74; 522/168; 522/170; 445/24
(58) Field of Search ............................ 522/81, 83, 170, 522/31, 25, 74, 168; 445/24

(56) References Cited

U.S. PATENT DOCUMENTS

| | | | | |
|---|---|---|---|---|
| 4,222,835 A | * | 9/1980 | Dixon | 522/13 |
| 4,252,592 A | * | 2/1981 | Green | 156/273.3 |
| 4,351,708 A | * | 9/1982 | Berner et al. | 522/25 |
| 5,274,148 A | * | 12/1993 | Dougherty et al. | 556/64 |
| 5,730,764 A | * | 3/1998 | Williamson et al. | 51/295 |
| 5,840,465 A | * | 11/1998 | Kakinuma et al. | 430/270.1 |
| 6,043,604 A | * | 3/2000 | Horiuchi et al. | 313/582 |
| 6,050,107 A | * | 4/2000 | Toyoda et al. | 65/17.6 |
| 6,306,948 B1 | * | 10/2001 | Yokoyama et al. | 524/492 |
| 6,352,763 B1 | * | 3/2002 | Dillon et al. | 428/325 |

FOREIGN PATENT DOCUMENTS

| | | |
|---|---|---|
| EP | 0 945 475 A1 | 9/1999 |
| EP | 1 130 036 * | 9/2001 |
| JP | 61-24126 | 2/1986 |
| JP | 6-87393 | 11/1994 |
| JP | 10-158031 | 6/1998 |

OTHER PUBLICATIONS

FR 2 727 416 A (Rhone Poulenc Chimie) May 31, 1996; abstract only.

* cited by examiner

Primary Examiner—Susan W. Berman
(74) Attorney, Agent, or Firm—Armstrong, Kratz, Quintos, Hanson & Brooks, LLP (57) ABSTRACT

A composition for a bulkhead of a thin display panel which is a mixed composition comprising a powder of glass or ceramic for molding a bulkhead of a thin display panel or a part thereof and a binder being an organic additive, wherein the above organic additive contains 15 to 50% by weight of a resin composition which generates heat energy by irradiation with an energy ray and which can be cured by energy coming from an energy ray source or the resulting heat energy. To provide a composition for a bulkhead which is used for molding a bulkhead constituting a discharge display cell of a thin display panel or mending a broken part thereof and which is improved in curability.

13 Claims, 2 Drawing Sheets

COMPOSITION FOR BULKHEAD OF THIN DISPLAY PANEL

FIELD OF THE INVENTION

The present invention relates to a composition for a bulkhead which is used for molding a bulkhead constituting a discharge display cell of a thin display panel or mending a broken part thereof, particularly to a composition for a bulkhead which is improved in curability based on an energy ray-curing resin composition, and a production process for a bulkhead using such composition.

BACKGROUND OF THE INVENTION

A thin display (particularly a large size) has been actively researched and developed as a next generation display panel, but it has not yet come to explosively spread at the present time. The largest cause thereof is a high cost in addition to a quality thereof such as a resolution on a picture plane, and particularly the price for general users has to be lowered to a large extent.

One of causes for expensiveness of the display described above resides in that a display panel, particularly a back face base panel is expensive, and the reason therefor is that a barrier rib has to be precisely worked.

The barrier rib described above is produced by shaving out a rib by means of a sand blast or piling up a rib by a printing method. A rib material comprises particles of glass and ceramic and a paste (organic substance: about 20% by weight) of an organic compound and are as very expensive as several ten thousand yen/kg. In a sand blast method, this is fixed on a back face glass base, and then a rib is shaved out. In this case, about 70% by weight is finally shaved off to become dusts (impossible to recycle), and the efficiency is very bad. Further, the sand blast has a low precision and takes time. On the other hand, waste of rib materials is reduced in the printing method, but printing is repeated to produce a rib, so that longer time than in the sand blast method is required for molding the rib, and the productivity is very inferior. Further, deviation is caused in piling up, and therefore the precision is not necessarily good.

The back face base can not help becoming expensive because of such reasons. Accordingly, the respective makers concentrate their efforts on research and development of a method by which the back face base can be manufactured at a low cost, and a hot press-embossing method has been developed as the simple production process by a part of them. However, the production speed has resultingly been almost the same as that of the sand blast because a rib is cured by hot curing, so that curing time therefor is required, and pressing is required during curing, so that the efficiency is inferior.

On the other hand, it has so far been investigated in various fields to apply an energy ray-curing resin having a characteristic of energy ray curing represented by UV curing to a barrier rib. However, a shortage in a capacity of energy ray curing is given as a factor which inhibits application thereof.

An energy ray-curing resin represented by a UV-curing resin is characterized by that only a part irradiated with a fixed amount or more of an energy ray is cured, and an energy ray represented by UV is characterized by that it is attenuated in the course of transmitting through the resin, so that a phenomenon of energy ray-curing is characterized by that it is influenced to a large extent by a curing capacity of the resin itself and an intensity, an irradiation time and an attenuation characteristic of the energy ray.

Methods which have so far been carried out in order to elevate an energy ray-curing capacity include an elevation in a performance of a photoinitiator, a rise in an intensity of an energy ray irradiated, an extension of an irradiating time and a change in the kind of energy rays.

However, when employing the methods described above, such problems that time and cost are taken for developing an initiator and a resin composition is expensive have been involved in the side of the resin composition. Also, problems such as an expansion in the apparatuses, an increase in consumed energy, a rise in the running cost, a reduction in the productivity, a specialization in a ray source, high costs of the apparatuses and the facilities and a reduction in the safety have been involved in the side of the energy ray irradiation apparatuses and the facilities. This has presented the state that it is resultingly difficult to use and apply the above methods themselves if the problems such as a loss of the advantages of energy ray-curing and an increase in the total cost are not solved.

Conventional high curability energy ray-curing resins represented by a high UV-curing resin have so far been dependent on development of novel photopolymerizable initiators which are effective for energy ray-curing or, though examples thereof are smaller than the above, development of novel photopolymerizable oligomers, and the situation has been that it is not necessarily possible to readily obtain the compositions suited to uses. Further, UV-heat combined curing type resins are characterized by that they have broader curing conditions. On the other hand, the preceding problems involved in the high curability energy ray-curing resins remain as they are. Further, requirement for a heating process leads to requirement for a heating apparatus and facilities, so that the advantages of energy ray-curing have been damaged as well in terms of an apparatus and facilities.

SUMMARY OF THE INVENTION

Accordingly, in light of the problems described above, the present inventors have repeated intensive researches in order to develop a novel material for a barrier rib which is excellent both in a productivity and a use efficiency of a material.

As a result thereof, the present inventors have found that employment of an emboss-molding process using a specific energy ray-curing resin for an organic additive in a bulkhead composition of a thin display panel as a composition for a bulkhead which has solved the problems of conventional techniques and which is excellent both in a productivity and a use efficiency of a material has made it possible to cure (achieve a prescribed dimension of a rib by single irradiation) those having a high content of shielding matters and a large thickness which have been hard to be cured by conventional photocuring and has made it possible to cure in short time (photo- and chain-curing) which has been difficult in a conventional pressing process and that the problems described above can be solved thereby. The present invention has been completed from such point of view.

That is, the object of the present invention can effectively be achieved by any of the following structures.

(1) A composition for a bulkhead of a thin display panel which is a mixed composition comprising a powder of glass or ceramic for molding a bulkhead of a thin display panel or a part thereof and a binder being an organic additive, wherein the above organic additive contains 15 to 50% by weight of a resin composition which generates heat energy by irradiation with an energy ray and which can be cured by energy coming from an energy ray source or the resulting heat energy.

(2) The composition for a bulkhead of a thin display panel as described in the above item (1), wherein the above resin composition is a resin composition which generates heat energy by irradiation with an energy ray and continuously generates heat energy by the resulting heat energy and which can be cured by energy coming from the energy ray source or the resulting heat energy.

(3) The composition for a bulkhead of a thin display panel as described in the above item (1) or (2), wherein the above heat energy is heat energy generated in the curing reaction.

(4) The composition for a bulkhead of a thin display panel as described in any of the above items (1) to (3), wherein the above resin composition comprises a photopolymerizable resin component which can be utilized for curing by irradiation with an energy ray and a photopolymerization initiator component which makes it possible to cure the above photopolymerizable resin component in irradiation with an energy ray.

In this regard, a cationic photopolymerization initiator is preferred as the photopolymerization initiator component from the viewpoint that the function as a photopolymerization initiator is maintained for a while after irradiation with an energy ray. The photopolymerization initiator component is added in an amount of 0.1 to 6.0 parts by weight, preferably 0.5 to 3.0 parts by weight per 100 parts by weight of the resin composition excluding the photopolymerizable initiator component.

(5) The composition for a bulkhead of a thin display panel as described in the above item (4), wherein the photopolymerization initiator component described above comprises a photo•thermopolymerization initiator which can initiate polymerization by both light and heat. (6) The composition for a bulkhead of a thin display panel as described in the above item (5), wherein the photo•thermopolymerization initiator component described above comprises a sulfonium salt represented by Formula (I), (I') or (II):

(I)

(I')

in the formulas described above, $R^6$ represents hydrogen, halogen, a nitro group or a methyl group; $R^7$ represents hydrogen, $CH_3CO$ or $CH_3OCO$; and X represents $SbF_6$, $PF_6$, $ASF_6$, $BF_4$ or $B(C_6F_5)_4$;

(II)

(in the formula described above, $R^1$ represents hydrogen, a methyl group, an acetyl group or a methoxycarbonyl group; $R^2$ and $R^3$ represent independently hydrogen, halogen or an alkyl group of $C_1$ to $C_4$; $R^4$ represents hydrogen, halogen or a methoxy group; $R^5$ represents an alkyl group of $C_1$ to $C_4$; and X represents $SbF_6$, $PF_6$, $AsF_6$, $BF_4$ or $B(C_6F_5)_4$.

(7) The composition for a bulkhead of a thin display panel as described in any of the above items (4) to (6), wherein the photopolymerization initiator component described above comprises a photopolymerization initiator comprising a binary or higher system containing a photopolymerization initiator and a photo-thermopolymerization initiator.

In this regard, a combination of the polymerization initiator component comprising a binary or higher system is preferably a case where contained are particularly at least one of aryl base sulfonium salts or iron-arene base compounds as the photopolymerization initiator and at least one of the sulfonium salts represented by Formula (I), (I') or (II) described above as the photo•thermopolymerization initiator. In the polymerization initiator component comprising a binary or higher system, the photo•thermopolymerization initiator is contained in a weight ratio of preferably 10 to 100% by weight, more preferably 20 to 80% by weight.

(8) The composition for a bulkhead of a thin display panel as described in any of the above items (1) to (3), wherein the resin composition described above comprises a photopolymerizable resin component which can be utilized for curing by irradiation with an energy ray, a photopolymerization initiator component which makes it possible to cure the above photopolymerizable resin component in irradiation with an energy ray and a curing agent component used for curing at least one of the above photopolymerizable resin components by a method other than irradiation with an energy ray.

In this regard, the curing agent component is contained in a proportion of 0.1 to 1.4 mol, particularly preferably 0.3 to 1.0 mole per mole of the resin component capable of being reacted with the curing agent component.

(9) The composition for a bulkhead of a thin display panel as described in the above item (8), wherein the resin composition described above further comprises a curing accelerator component which accelerates curing when curing at least one of the above photopolymerizable resin components and the curing agent component by a method other than irradiation with an energy ray.

In this regard, the curing accelerator component is contained in a proportion of preferably 0.04 to 0.6 mole, particularly preferably 0.08 to 0.4 mole per mole of the curing agent component.

(10) The composition for a bulkhead of a thin display panel as described in any of the above items (4) to (9), wherein the photopolymerizable resin component described above comprises an epoxy resin component having a cyclic ether structure in a molecular structure.

In this regard, 3,4-epoxycyclohexylmethyl-3,4-epoxycyclohexanecarboxylate is preferably contained as the epoxy resin component from the viewpoints of a richness in the kind and matching with the cationic photopolymerization initiator.

(11) The composition for a bulkhead of a thin display panel as described in any of the above items (8) to (10), wherein the curing agent component described above comprises an acid anhydride or a derivative thereof. In this regard, maleic anhydride or a derivative thereof is preferably contained as the curing agent component.

(12) The composition for, a bulkhead of a thin display panel as described in any of the above items (8) to (10), wherein the curing agent component described above comprises monohydric or polyhydric alcohols. In this regard, polyethylene glycol is preferably contained as the curing agent component.

(13) The composition for a bulkhead of a thin display panel as described in any of the above items (8) to (10), wherein the curing agent component or the curing accelerator component described above comprises an acid anhydride or a derivative thereof and monohydric or polyhydric alcohols.

(14) A production process for a bulkhead, comprising molding a bulkhead of a thin display panel or a part thereof with the composition for a bulkhead of a thin display panel described above, curing the above molded article and then baking it. In this regard, heat curing and room temperature curing in addition to irradiation with an energy ray are used as a curing means for the above molded article.

(15) The production process for a bulkhead as described in the above item (14), wherein the above composition for a bulkhead used as the composition for a bulkhead of a thin display panel is heated in advance to such an extent that it is not cured.

The thin display panel in the present invention means a group of monitors for display which have different systems from those of conventional TV monitors such as a plasma display panel (PDP) and a liquid crystal display (LCD) and which are characterized by a small thickness. With respect to the bulkhead of a thin display panel, the respective fluorescent substances of RGB are partitioned by means of walls projecting upward from a glass base (back face) in a structure of a plasma display, and this partition wall is called a bulkhead (barrier rib).

Such composition for a bulkhead of the present invention can be cured by an energy ray (and heat energy) such as UV and is followed by chain curing making use of curing reaction heat of itself in curing. Accordingly, it can be cured in short time regardless of the presence of an energy ray-shielding substance, the film thickness, the dimension and the form. This makes it possible to mold the composition by an embossing method having an excellent efficiency and cure it in short time.

Figure 2:
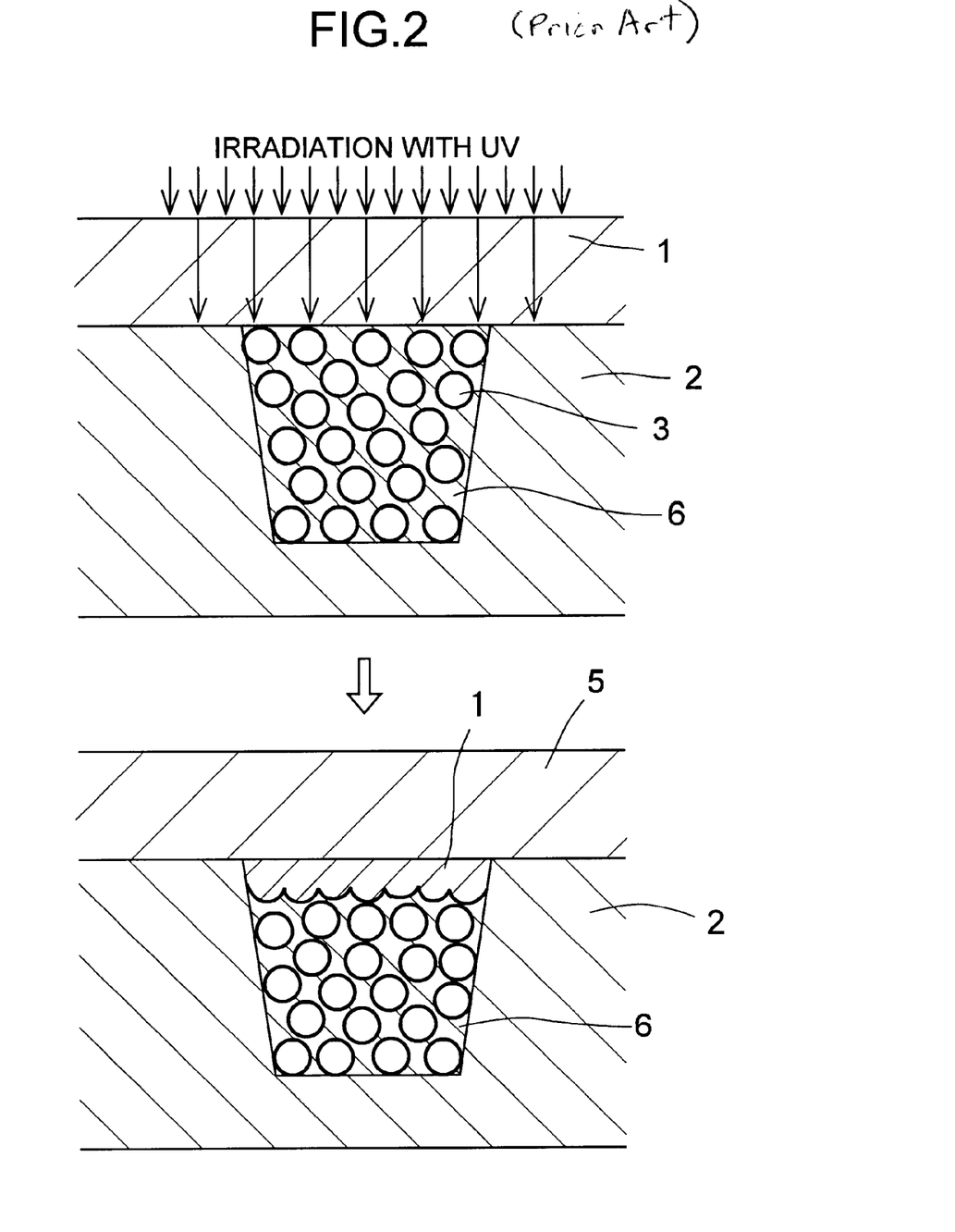
FIG. 2 is a drawing showing a part of a production flow (curing step) in producing a bulkhead using a conventional material for a bulkhead.

As shown in FIG. 2, only a part irradiated in a UV energy amount required for curing is cured in a printing method using a conventional UV-curing resin, and therefore a thick film part which does not receive an effective energy amount and a part which is so highly charged with a filler that it is shielded from UV have not been able to be cured. Accordingly, it has been difficult to cure a rib at one time to produce it. Further, a circumferential temperature (a resin temperature) has to be elevated in a heat pressing method using conventional thermosetting resins, so that the energy efficiency has been low, and heat curing (and room temperature curing) has been slow in a curing speed as compared with that in energy ray-curing. Accordingly, there has been the problem that curing in short time is difficult and the productivity is low.

In this regard, according to the composition for a bulkhead of the present invention, given are advantages such as: (i) waste of a rib material is small, and a photosensitive agent for lithography is not required, so that the material cost is reduced; (ii) short time-curing makes it possible to mold a rib in short time, and therefore the high productivity, easier molding, possibility in continuous production and a reduction in steps (maskless, washingless) are achieved; (iii) single irradiation with an energy ray enables curing which is equivalent to or higher than irradiation of several times in a conventional printing method, so that energy saving is achieved, and the running cost is reduced; (iv) expensive facilities such as a lithography and a press are not required, and the facility cost is controlled low; (v) dusts are not produced, and cleanliness is maintained, so that the system contributes to a reduction in waste and is clean and free of dusts; (vi) the accuracy is secured by a die, and scattering in a quality of the product is small, so that the high accuracy is achieved; and (vii) the ideal form going toward the high luminance can be molded by a die, so that the high luminance and the high performance can readily be achieved.

The present invention shall be explained below based on embodiments, but the present invention shall by no means be restricted to these embodiments.

BRIEF DESCRIPTION OF THE DRAWINGS

The reference characters given in these figures are defined as follows: 1,Glass substrate; 2,Embossing die; 3,Ceramic and the like; 4,organic additive; 5,UV-cured part; 6,Organic additive; 7,Heat-cured part.

DETAILED DESCRIPTION OF THE INVENTION

Among thin display panels, a plasma display panel used for a high accuracy and inexpensive color display equipment for a large-sized picture plane is usually provided with a group of opposite electrodes in a space surrounded by two flat insulating boards called a fine discharge display cell and a bulkhead. Dischargeable gas such as rare gas is sealed in the space described above to form an airtight structure, and voltage is selectively applied between the opposite electrodes described above to generate plasma by discharge. A UV ray discharged from this plasma allows fluorescent substances formed on an inner wall of the discharge display cell to emit light to make them luminescent elements of the picture plane. Accordingly, a height of, for example, ±10 $\mu$m or lower is required to the bulkhead described above, and in order to prevent mixing of displayed colors in the discharge display cell caused by leakage of plasma produced by discharge, the bulkhead has to be free of form defects such as defection and deformation in maintaining airtightness.

A general production process for a bulkhead part of a thin display panel includes a printing method and a sand blast method. In the printing method, a paste of a bulkhead material is used to mold a bulkhead for a discharge display cell requiring a height of about 100 to 200 $\mu$m with a prescribed form of the discharge display cell being used as a pattern while repeating printing and drying by a thick film-printing method. In the sand blast method, a light-sensitive film is used to carry out exposure and development, and a resist is removed after blast treatment, followed by baking, whereby a concave part of the bulkhead is formed. Further, in addition thereto, included are an embossing method carried out by a hot press, a method in which a molding die having a concave part structure in a bulkhead form is charged with a bulkhead material to carry out molding and a method in which, as is the case with a photolithography, a light-sensitive layer provided on an insulating substrate is exposed to light or a UV ray through a pattern mask and then developed to form an aperture part and an insulating paste is put into the above aperture part to form a bulkhead.

In the case where the whole bulkhead constituting the discharge display cell is molded by such production process for a bulkhead part of a thin display panel as described above or in order to supplement and repair a defective part of the bulkhead, the composition for a bulkhead of the present invention is used when it is used for the bulkhead by a brush coating method, an injection method by a microsyringe method, a roll print method and a spray method. The above molded article or the defective part is cured in the air and then integrally baked together with the insulating substrate.

The following shall be given as one example of the production process for barrier rib by an embossing method by UV chain curing using the composition for a bulkhead of the present invention.

First, a lithography die having a convex part on a base material is produced, and the convex part is subjected to Ni—P plating. Then, this is used to produce a resin die of a teflon base such as PTFE. On the other hand, a bulkhead composition having a composition described later is filled as a rib paste into a groove surrounded by the resin die and a glass substrate. This is irradiated from a glass substrate face side with an energy ray (UV and the like) by means of, for example, a UV lamp to cure the composition for a bulkhead, and then it is separated from the die by drawing the die. Finally, it is baked by means of a heater.

In this case, it is effective not only for a rise in the reactivity (shortening of the curing time) but also a reduction in the viscosity (easy to be filled into the die) to heat in advance the composition for a bulkhead used as the rib paste to such an extent that it is not cured, and therefore it is preferred.

Also, not only irradiating with an energy ray but also heating at the same time is effective from the viewpoint of a rise in the reactivity (shortening of the curing time).

Figure 1:
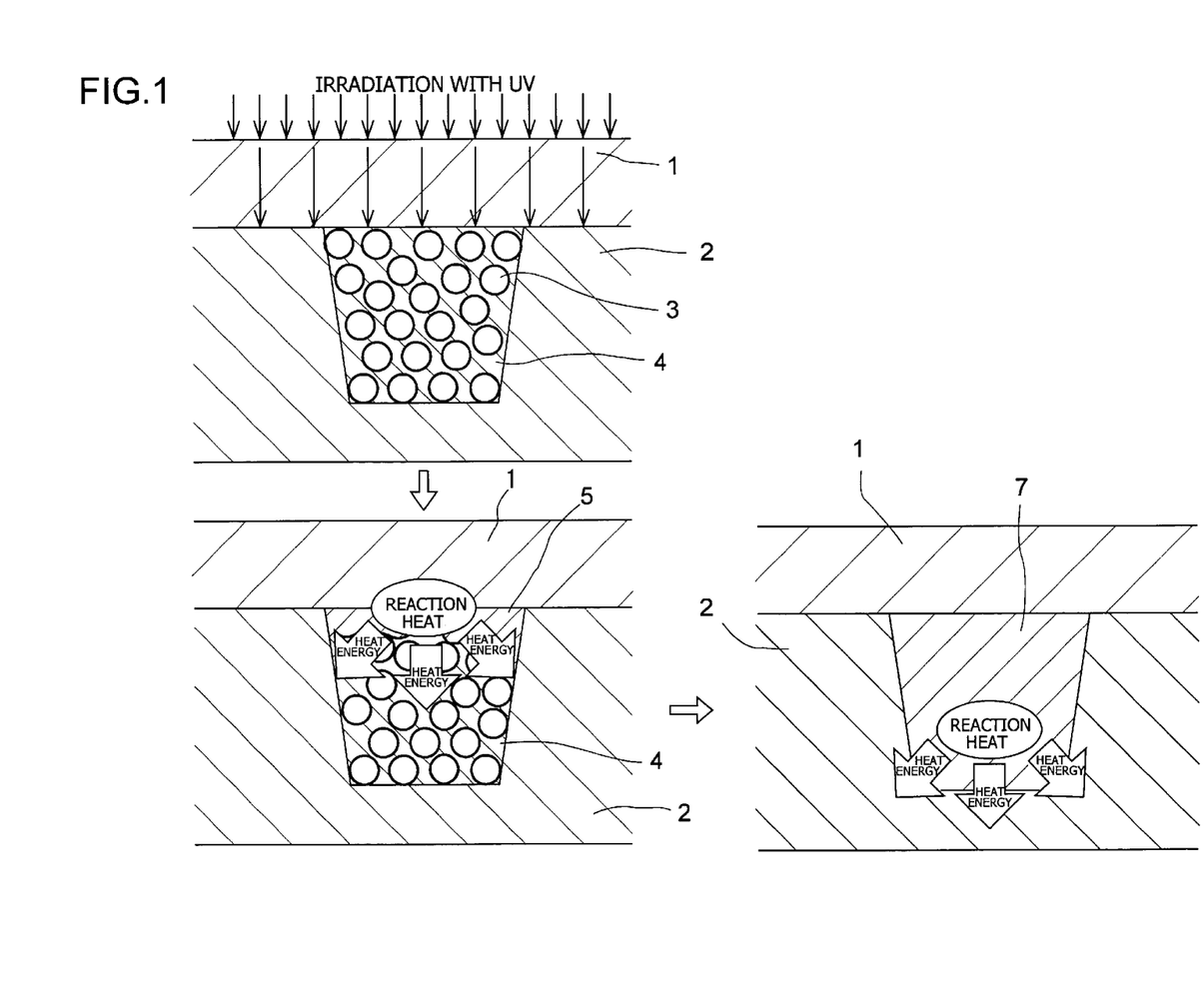
FIG. 1 is a drawing showing a part of a production flow (curing step) in producing a bulkhead using the composition for a bulkhead of the present invention.

In irradiation with UV, the composition for a bulkhead is put into a concave part of an embossing die 2 as shown in FIG. 1, and a glass substrate 1 is provided on the surface to be irradiated. A barrier rib material which is the composition for a bulkhead is composed mainly of ceramic or glass 3 and an Organic additive 4.

When irradiation with UV is carried out as shown in FIG. 1, a surface part brought into contact with a glass face is first cured with an energy ray (UV curing). In this case, reaction heat is produced in a UV-cured part 5, and the heat is transferred to the depth. The organic additive 4 is chainwise cured as well by this reaction heat (or cation and the like). Chain curing caused by the reaction heat deepens a heat-cured part 7, and finally the whole barrier rib material is cured.

Glass or ceramic powder used for the composition for a bulkhead of the present invention shall not specifically be restricted and includes powders of soda lime glass, low soda glass, lead alkali silicate glass, borosilicate glass and various glasses containing sulfur (S), selenium (Se), alum and the like, and various ceramic materials of an oxide base such as alumina and zirconia and a non-oxide base such as silicon nitride, aluminum nitride and silicon carbide. Prescribed amounts of various sintering aids can be added to these glass and ceramic powders.

A particle diameter of the glass or ceramic powder shall not specifically be restricted, and usually those having a particle diameter of several 10 $\mu$m to submicron are suitably used. Fine powders having a particle diameter of 2 $\mu$m or less are particularly preferred from a viewpoint to increase a density of the bulkhead-molded article.

The organic additive used in the present invention contains usually the following specific resin composition in a proportion of 15 to 50% by weight. If the resin composition accounts for less than 15% by weight, the powder component of glass which is a principal component for the mixed composition has an unsatisfactory form-holding property to cause dripping or deformation of the bulkhead-molded article, and therefore it is not preferred. On the other hand, if the proportion of the resin composition exceeds 50% by weight, a residue is formed on the inside of the bulkhead after baking by virtue of the heat decomposition property and exerts an adverse effect on display in emitting light, and therefore it is not preferred.

Addition of a coupling agent makes it possible to improve compatibility between the powder of glass or ceramic described above and the resin composition and to reduce a viscosity of the mixed composition or an adhesive strength thereof with the glass substrate.

The resin composition generates heat energy by irradiation with an energy ray and can be cured by energy coming from an energy ray source or the resulting heat energy, or generates heat energy by irradiation with an energy ray, continuously generates heat energy by the resulting heat energy and can be cured by energy coming from the energy ray source or the resulting heat energy. Usually, the above heat energy is heat energy generated in the curing reaction.

The resin composition described above comprises a photopolymerizable resin component which can be utilized for curing by irradiation with an energy ray and a photopolymerization initiator component which makes it possible to cure the above photopolymerizable resin component in irradiation with an energy ray. This photopolymerization initiator component comprises preferably a photo-thermopolymerization initiator which can initiate polymerization by both light and heat and may be a photopolymerization initiator comprising a binary or higher system containing a photopolymerization initiator and a photo-thermopolymerization initiator.

Further, the resin composition described above comprises preferably, in addition to the photopolymerizable resin component and the photopolymerization initiator component, a curing agent component used for curing at least one of the above photopolymerizable resin components by a method other than irradiation with an energy ray and further in addition thereto, a curing accelerator component which accelerates curing.

Use of such resin composition makes it possible to provide the curing capacity other than a conventional photocuring mechanism and elevate the curing capacity at a low cost, provides the high curing capacity, makes the resin composition inexpensive and makes it possible to readily control the resin characteristics.

The energy ray described above includes a UV ray (UV) and in addition thereto, an electron beam (ED), an X ray, an infrared ray, sunlight, a visible ray, various lasers (excimer laser, $CO_2$ laser, argon laser and the like) and a heat ray (emission and radiation). The resin composition used in the present invention can be cured by heat as well as light and electromagnetic wave as energy to be given. Further, in view of such characteristic of the resin composition, it is effective for elevating the characteristic of energy ray-curing to heat the resin composition in advance to such an extent that it is not cured.

In the present invention, capable of being given as examples of the photopolymerizable resin component are various acrylates represented by, for example, epoxy acrylate, epoxidized oil acrylate, urethane acrylate, polyester acrylate, polyether acrylate, vinyl acrylate and polystyrylethyl methacrylate, various epoxies represented by alicyclic epoxy, glycidyl ether type epoxy, bisphenol type epoxy and novolak type epoxy, various photopolymerizable oligomers such as unsaturated polyester, polyene/thiol, silicon, polybutadiene, vinyl ether compounds and epoxidized polyolefin, and various photopolymerizable monomers such as epoxy monomers, acryl monomers, vinyl ethers and cyclic ethers. However, it shall not be restricted to them.

Capable of being given as examples of the photopolymerization initiator component are radical photopolymerization initiators, cationic photopolymerization initiators and anionic photopolymerization initiators, though different in an aptitude depending on the aimed photopolymerizable resin component, for example, compounds of a diazonium salt type as shown in the following Table 1, compounds of a iodonium salt type as shown in the following Table 2, compounds of a pyridinium salt type represented by the following formula:

compounds of a phosphonium salt type as shown in Japanese Patent Application Laid-Open No. 157624/1994 and Japanese Patent Application Laid-Open No. 82283/1995, compounds of a sulfonium salt type as shown in the following Table 3, compounds of an iron-arene compound type represented by the following Formulas (III), (IV) and (V):

(III)

(IV)

(V)

(wherein $X^-$ represents $BF_4^-$, $PF_6^-$, $AsF_6^-$ or $SbF_6^-$, and R represents an alkyl group), compounds of a sulfonic acid ester type, the photo-thermopolymerization initiators represented by Formula (I), (I') and (II) described above, P1 tyke photopolymerization initiators shown in the following Table 4, P2 type photoplymerization initiators shown in the following Table 5, and optical base-generating agents such as Co-amine complexes, o-acyloximes, benzyloxycarbonyl derivatives and formamide. However, it shall not be restricted to them.

The curing agent component is varied depending on the corresponding resin component, and capable of being given as examples thereof are, for example, epoxies and isocyanates when the photopolymerizable resin component contains a hydroxyl group and amines, acid anhydrides and polyols when it contains an epoxy group. However, it shall not be restricted thereto, provided that a relation in which curing (chemical reaction) other than energy ray-curing such as room temperature curing and heat curing is possible has to be set up between the curing agent component and at least one of the photopolymerizable resin components. The curing agent component, the photopolymerizable resin component and the photoinitiator component each may comprise plural components.

Even if a positional relation between the curing agent component and the photopolymerizable resin component is replaced in a certain case, and the photopolymerizable resin component is positioned as the curing agent component (the case where usually, a principal component of the composition is the resin component and a subsidiary component thereof is the curing agent component, but they are reversed and where a principal component of the composition is the curing agent component and a subsidiary component thereof is the photopolymerizable resin component), they can be used in the present invention as long as the relation described above is set up. It is no problem that the curing agent component for some one kind of the photopolymerizable resin component is a photopolymerizable resin component.

Further, other components may be added to such resin component and, for example, other photopolymerizable resin components having no relation with the curing agent component and a photopolymerization initiator component related thereto may be added.

The curing accelerator component is varied as well depending on the photopolymerizable resin component and the curing agent component, and capable of being given as examples thereof are, for example, monohydric or polyhydric alcohols and acid anhydrides for amines and monohydric or polyhydric alcohols and amine for acid anhydrides. However, it shall not be restricted thereto. Provided that the curing accelerator component has to have a function for accelerating a curing reaction (chemical reaction) which can take place between the curing agent component and at least one of the photopolymerizable resin components described above.

In this case, other components and the curing accelerator component each may comprise plural components as is the case with the curing agent component. In some cases, considered are the case where the curing accelerator component has the functions of the curing agent component and the photopolymerizable resin component and the case where the photopolymerization initiator component has the function of the curing agent component which is defined in the present invention. In any cases, however, they can be used in the present invention as long as they have the curing reaction-accelerating function described above. In general, in the case of the components (substances) functioning either as a curing agent component or a curing accelerator component, positioning of the above components (substances) is distinguished in many cases by a proportion of the contents contained in the composition. For example, when an acid anhydride has a larger proportion, the acid anhydride acts as the curing agent component, and alcohols act as the curing accelerator component. On the other hand, when the alcohols have a larger proportion, the alcohols act as the curing agent component, and the acid anhydride acts as the curing accelerator component. When the amounts of both are large, both sides have both functions. In addition thereto, when both the curing accelerator component and the curing agent component can react with at least one of the photopolymerizable resin components, easier curing can be expected.

Specific examples of the resin composition used in the present invention include, for example a resin composition comprising epoxy acrylate (photopolymerizable resin component), a radical photopolymerization initiator (photopolymerization initiator component), an acid anhydride (curing agent component) and polyol (curing accelerator component), a resin composition comprising epoxy acrylate and an epoxy resin (photopolymerizable resin components), a radical photopolymerization initiator and a cationic photopolymerization initiator (photopolymerization initiator components) and an acid anhydride (curing agent component), a resin composition comprising an epoxy resin (photopolymerizable resin component), a cationic photopolymerization initiator (photopolymerization initiator component), an acid anhydride (curing agent component) and polyol (curing accelerator component), and a resin composition comprising an epoxy resin (photopolymerizable resin component), an anionic photopolymerization initiator (photopolymerization initiator component), amines (curing agent component) and an acid anhydride (curing accelerator component). However, it shall not be restricted thereto.

It is important for attention points of the material design of the resin composition described above to avoid curing inhibition from being caused between various components contained in the resin composition, particularly between the photopolymerization initiator component and other components. For example, amines which are a curing inhibition substance for a cationic photopolymerization initiator have to be avoided from being used when using the cationic photopolymerization initiator.

TABLE 1

Aryldiazonium salt photoinitiator

| Cationpart (diazonium) | Anion part | Maximum wavelength (nm) |
|---|---|---|
| 2,5-Diethoxy-4-(p-toluyl-mercapto)benzene | $BF_4^-$ | 355, 391 |
| 2,4-Dichlorobenzene | $SnCl_6^-$ | 285 |
| p-Nitrobenzene | $FeCl_4^-$ | 243, 257, 310, 360 |
| p-Chlorobenzene | $PF_6^-$ | 273 |
| p-(N-morpholino)benzene | $AsF_6^-$ | 257, 378 |
| 2,5-Dichlorobenzene | $SbF_6^-$ | 238, 358 |
| o-Nitrobenzene | $BCl_6^-$ | 285, 313 |

TABLE 2

Aromatic iodonium salt photoinitiator

| | Cation part | Anion part | λ MAX(nm) | ε MAX |
|---|---|---|---|---|
| 1. | Ph–I⁺–Ph | $BF_4^-$ | 227 | 17,800 |
| 2. | $CH_3$–Ph–I⁺–Ph–$CH_3$ | $BF_4^-$ | 236 | 18,000 |
| 3. | $CH_3$–Ph–I⁺–Ph–$CH_3$ | $BF_4^-$ | 237 | 18,200 |
| 4. | $CH_3$–Ph–I⁺–Ph–$CH_3$ | $AsF_4^-$ | 237 | 17,500 |

TABLE 2-continued

Aromatic iodonium salt photoinitiator

| | Cation part | Anion part | λ MAX(nm) | ε MAX |
|---|---|---|---|---|
| 5. | CH$_3$—⟨C$_6$H$_4$⟩—I$^+$—⟨C$_6$H$_4$⟩—CH$_3$ | BF$_4^-$ | 238 | 20,800 |
| 6. | CH$_3$—⟨C$_6$H$_4$⟩—I$^+$—⟨C$_6$H$_4$⟩—CH$_3$ | PF$_6^-$ | 238 | 20,000 |
| 7. | CH$_3$—⟨C$_6$H$_4$⟩—I$^+$—⟨C$_6$H$_4$⟩—CH$_3$ | AsF$_6^-$ | 238 | 20,700 |
| 8. | CH$_3$—⟨C$_6$H$_4$⟩—I$^+$—⟨C$_6$H$_4$⟩—CH$_3$ | SbF$_6^-$ | 238 | 21,200 |

TABLE 3

Triaryl sulfonium salt photoinitiator

| | Cation part | Anion part | λ MAX(nm) | ε MAX |
|---|---|---|---|---|
| 1. | (C$_6$H$_5$)$_3$S$^+$ | BF$_2^-$ | 230 | 17,500 |
| 2. | (C$_6$H$_5$)$_3$S$^+$ | AsF$_6^-$ | 230 | 17,500 |
| 3. | CH$_3$—⟨C$_6$H$_4$⟩—S$^+$—(⟨C$_6$H$_5$⟩)$_2$ | PF$_6$ | 237<br>240 | 20,400<br>19,700 |
| 4. | (CH$_3$O—⟨C$_6$H$_4$⟩)$_3$S$^+$ | AsF$_6^-$ | 225<br>280 | 21,740<br>10,100 |
| 5. | (CH$_3$O—⟨C$_6$H$_4$⟩)$_3$S$^+$ | BF$_2^-$ | 243<br>278 | 24,700<br>4,900 |
| 6. | (HO—⟨C$_6$H$_2$(CH$_3$)$_2$⟩)$_3$S$^+$ | AsF$_6^-$ | 263<br>280<br>316 | 25,200<br>22,400<br>7,700 |

TABLE 4

P1 type photoinitiator (acetophenone structure)

| Name | R | $R_1$ | $R_2$ | $R_3$ |
|---|---|---|---|---|
| Benzoin butyl ether | H | $OC_4H_9$ | H | $C_6H_5$ |
| Benzyl dimethyl ketal | H | $OCH_3$ | $OCH_3$ | $C_6H_5$ |
| Ethoxyacetophenone | H | $OC_2H_5$ | $OC_2H_5$ | H |
| Acyloxime ester | H | NOCO | $CH_3$ | $C_6H_5$ |
|  | H | NOCO | $OC_2H_5$ | $CH_3$ |
| Chlorinated acetophenone | $C_4H_9$ | Cl | Cl | Cl |
| Hydroxyacetophenone | H | OH | $CH_3$ | $CH_3$ |

Acylphosphine oxide

TABLE 5

P2 type photoinitiator (thioxanthone structure)

| Name | X | R | $R_1$ |
|---|---|---|---|
| Benzophenone | — | R | H |
| Michler's ketone | — | $(CH_3)_2N$ | $(CH_3)_2N$ |
| Dibenzosuberone | $CH_2-CH_2$ | H | H |
| 2-Ethylanthraquinone | C=O | H | $2-C_2H_5$ |
| Isobutylthioxanthone | S | H | $2-i-C_3H_7$ |

Benzyl

In particular, from the viewpoints that many kinds of the curing agent component and the curing accelerator component are available and the cured matters have good physical properties, an epoxy resin component is preferred as the photopolymerizable resin component, and 3,4-epoxycyclohexylmethyl-3,4-epoxycyclohexanecarboxylate is particularly preferred.

Acid anhydrides or derivatives of acid anhydrides and monohydric or polyhydric alcohols are particularly preferred as the curing agent component or the curing accelerator component. The acid anhydrides include, for example, compounds shown in Table 6, and the monohydric or polyhydric alcohols include compounds having a hydroxyl group in a chemical structure, such as phenols, novolaks, glycols, alcohols and polyols. They are particularly preferred as well in the case of the epoxy resin component described above.

TABLE 6

Examples of acid anhydrides

Maleic anhydride | Citraconic anhydride | Itaconic anhydride | Succinic anhydride | Phthalic anhydride TABLE 6-continued Examples of acid anhydrides Linolenic acid adduct of maleic anhydride Maleic anhydride-vinyl ether copolymer Alkenylic anhydride Maleic anhydride-styrene copolymer Maleic anhydride adduct of methyl-cyclopentadiene Tricarballylic anhydride Chlorendic acid Alkylated endoalkylene-tetrahydrophthalic anhydride Dodecenylsuccinic anhydride Methyl-disubstituted-butenyltetrahydo-phthalic anhydride Hexahydophthalic anhydride Ethylene glycol bis-trimellitate Methyltetrahydophthalic anhydride Pyromellitic anhydride Glycerin trimellitate TABLE 6-continued Examples of acid anhydrides Cyclopentane-tetracarboxylic anhydride Benzophenone-tetracarboxylic anhydride When the epoxy resin component is used as the photopolymerizable resin component, considered as the curing agent component and the curing accelerator component are compounds having functional groups which can react with the epoxy groups shown in Table 7 (a carboxylic anhydride group, a carboxylic acid group, a hydroxyl group, an amine group, an amide group, a urethane group, a urea group, an isocyanate group and in addition thereto, functional groups described in Table 7). Capable of being given as general examples are amines, amides (polyamide resins), acid anhydrides and phenols as the curing agent component, and acid anhydrides, polyols and amines as the curing accelerator component. In particular, preferred are compounds comprising the components of acid anhydrides or derivatives of acid anhydrides and monohydric or polyhydric alcohols. Also, compounds containing no nitrogen atom in a molecular structure of such components are preferred in making a material design since it is less liable to bring about curing inhibition when they are combined with a cationic photopolymerization initiator.

TABLE 7

Examples of functional group capable of reacting with epoxy group

| Reagent → | Product | Reagent → | Product | Reagent → | Product |
|---|---|---|---|---|---|
| $H_2O$ Water | Glycol (OH OH) | RCHO $R_1COR$ Aldehyde ketone | Acetal ($R_1$, R) | $Na_2SO_3$ Sodium sulfite | Hydroxy-sulfonic acid (OH $SO_3Na$) |
| $HNO_3$ Nitric acid | Nitric ester (OH $ONO_2$) | $PCl_3$ Phosphorus trichloride | $P(OCH_2CH_2Cl)_3$ Tri-Hydrogen ester | ROH Alcohol | Hydroxy-ether (OH OR) |
| $NH_2$ Ammonia | Amino-Alcohol (OH $NH_2$) | $C_6H_5$ Benzene | Alcohol (OH φ) | $H_2$ Hydrogen | Alcohol (OH H) |
| HCN Hydrogen cyanide | Cyan-hydrin (OH CN) | NaOH Alkali fusion | | $R(COOH)_2$ Dibasic acid | CH≡CNa Sodium acetylide | Acetylene alcohol (OH C≡CH) |

TABLE 7-continued

Examples of functional group capable of reacting with epoxy group

| Reagent → | Product | Reagent → | Product | Reagent → | Product |
|---|---|---|---|---|---|
| C₄H₅OH Phenol |  Hydroxy-phenyl ether | HCl Hydro-chloric acid |  Choro-hydrin | H₂S Hydrogen disulfide |  Hydroxy-thiol |
| RMgX Grignard Reagent |  Alcohol | RCOOH Organic |  Hydroxy-ester | CH₃COCl Acetyl chloride |  Chloro-ester |
| | | R₂NH Secondary amine |  Amino-alcohol | RSH Mer-captan | Hydroxy-thioether |

In particular, maleic anhydride or a derivative thereof is preferred as an acid anhydride from the viewpoints of a price, a reactivity and characteristics, and particularly preferred is the resin composition comprising 3,4-epoxycyclohexylmethyl-3,4-epoxycyclohexanecarboxylate, maleic anhydride or a derivative thereof and a cationic photopolymerization initiator. In particular, polyethylene glycol is preferred as monohydric or polyhydric alcohols from the viewpoints of reactivity control, molecular weight control and characteristic control, and particularly preferred is the resin composition comprising 3,4-epoxycyclohexylmethyl-3,4-epoxycyclohexanecarboxylate, maleic anhydride or a derivative thereof, polyethylene glycol and a cationic photopolymerization initiator.

Further, with respect to a composition proportion of the resin composition, the curing agent component has preferably a proportion of 0.1 to 1.4 mole per mole of the resin component which can react with the curing agent component, and the curing agent component has particularly preferably a proportion of 0.3 to 1.0 mol per mol of the resin component which can react with the curing agent component. In the case of heat curing, a proportion of the resin component to the curing agent component can stoichiometrically be decided to some extent, and if exceeding a range thereof, it becomes difficult to obtain the cured matter having good physical properties. On the other hand, in the case of energy ray-curing, curing is advanced with the resin component alone by virtue of the photopolymerization initiator. The present invention has both characteristics of energy ray-curing and heat curing. Accordingly, if the curing agent component falls outside the range described above and is too small, the curing capacity-elevating effect which is the characteristic of the present invention (almost simultaneous progress of different curing mechanisms of energy ray-curing and heat curing caused by heat produced in the above curing and prevention of a shortage in curing) brought about by a curing mechanism other than irradiation with an energy ray is hard to be displayed. In contrast with this, if it is too large, the resin component required for energy ray-curing is relatively reduced, so that a reduction in the energy ray-curing capacity and a reduction in the heat amount produced by curing are bought about, and the curing characteristics are reduced. Also, when it exceeds a stoichiometric limit and is large, it becomes difficult to obtain the cured matter having good physical properties.

The curing accelerator component has preferably a proportion of 0.04 to 0.6 mole per mole of the curing agent component, and the curing accelerator component has particularly preferably a proportion of 0.08 to 0.4 mole per mole of the curing agent component. If the curing accelerator component falls outside the range described above and is too small, an accelerating effect of the curing reaction can not be displayed. On the other hand, if it is too large, more curing reaction-accelerating effect than in adding the optimum amount can not be expected, and it is not rather preferred since brought about are a slowdown in the curing reaction, an inhibition of energy ray-curing and a waste of the heat amount generated by curing.

A cationic photopolymerization initiator is particularly preferred as the photopolymerization initiator. In particular, the iron-allene base compounds represented by Formulas (III), (IV) and (V) described above are preferred since if they are contained in the resin composition, the curing characteristic is elevated to a large extent. For example, the resin composition comprising 3,4-epoxycyclohexylmethyl-3,4-epoxycyclohexanecarboxylate, maleic anhydride and the compound represented by Formula (III) described above is improved in a curing capacity to such an extent that it is easily cured by sunlight and shows a high curing property.

Further, a photo•thermopolymerization initiator is preferably used as well. In particular, if the sulfonium salt represented by Formula (I), (I') or (II) is contained in the resin composition, the curing characteristic is elevated to a large extent, and a chain curing reaction which has so far been difficult without using a binary photopolymerization initiator becomes possible with a single polymerization initiator.

For example, the resin composition comprising 3,4-epoxycyclohexylmethyl-3,4-epoxycyclohexanecarboxylate, maleic anhydride and the compound represented by Formula (IV) is improved in a curing capacity to such an extent that it causes a chain-curing reaction only by adding about 0.5 wt % of the compound represented by Formula (I) and shows a high curing property.

Further, preferred as well is the photopolymerization initiator comprising a binary or higher system comprising components of a photopolymerization initiator and a photo•thermopolymerization initiator. In particular, the photopolymerization initiator comprising a binary or higher system comprising an aryl base sulfonium salt type or at least one of the iron-allene base compounds represented by Formula (III), (IV) and (V) and at least one of the sulfonium salts represented by Formula (I), (I') or (II) elevates the curing characteristic to a large extent if it is used for the resin composition.

For example, the resin composition comprising 3,4-epoxycyclohexylmethyl-3,4-epoxycyclohexanecarboxylate, maleic anhydride and the photopolymerization initiator comprising the binary or higher system described above is improved in a curing capacity and shows a high curing property, so that it readily brings about a chain curing reaction.

Further, preferred as well is a photopolymerization initiator obtained by adding a suitable thermopolymerization initiator (for example, prenyl-tetramethylenesulfonium hexafluoroantimonate and the like) to a photopolymerization initiator, a photo-thermopolymerization initiator and the photopolymerization initiator comprising the binary or higher system described above, and easier curing can be expected from an improvement in the heat curing capacity.

Further, with respect to a composition proportion of the resin composition, the photopolymerization initiator has preferably a proportion of 0.1 to 6.0 parts by weight, particularly preferably 0.5 to 3.0 parts by weight per 100 parts by weight of the whole weight of the other components than the photopolymerization initiator. If the photopolymerization initiator component has a proportion of less than 0.1 part by weight, the effect thereof is scarcely shown, and the small amount to the whole makes the initiator itself less liable to function. On the other hand, even if the proportion exceeds 6.0 parts by weight, the photocuring capacity itself does not change.

The photo•thermopolymerization initiator constituting the photopolymerization initiator comprising a binary or higher system accounts preferably for 10 to 100% by weight, particularly preferably 20 to 80% by weight in terms of a weight ratio. In a conventional photopolymerization initiator comprising a binary or higher system, a photo-thermopolymerization initiator has preferably a weight ratio of 50 to 80% by weight, but the function of chain curing is displayed even in the percentage described above. However, if the weight ratio is small, the characteristic of chain curing tends to be less liable to be displayed, and if the weight ratio is large, the chain curing tends to be less liable to be controlled.

Further, capable of being added to the resin composition in a curable range is at least one of conventionally used additives such as energy ray-shielding materials (for example, carbon and carbon fiber (short fiber, long fiber, continuous fiber, carbon cloth and the like), an inorganic filler and metal powder), various fillers, an organic component, a light-sensitive agent, a reactive diluent, a photosensitizer and an acid-increasing agent.

The production process for the resin composition used in the present invention shall by no means be restricted. It is enough if the resin composition comprising the components is finally obtained, and the temperature, the stirring time, the presence of shielded light and the adding order can suitably be determined according to, for example, the composition and the characteristics of the resin composition produced.

When the respective components of the curing agent component, the curing accelerator component and the photopolymerization initiator component have a high reactivity with the photopolymerizable resin composition, particularly when the reactivity to a temperature is high and curing can be advanced at a room temperature for short time, the reaction is carried out preferably at a low temperature while stirring considering so that the reaction does not proceed. When stirring solid matters or less soluble components, stirring for long time or treatment in which they are dissolved in advance in a solvent to make them liquid are preferred.

When the photopolymerization initiator component can easily be optically reacted in a production environment or it takes long time from adding the photopolymerization initiator component to completion of the production, light shielding and replacement of the addition order are effective. The curing reaction is initiated and advanced or a side-reaction takes place in a certain case depending on the addition order, and in this case, replacement of the addition order is effective as well. The resin composition has a high curability and can be cured by both of heat and an energy ray, and therefore the production conditions have to be set so that the curing reaction does not take place.

According to the composition for a bulkhead of the present invention, given are excellent effects such as: (i) waste of a rib material is small, and a photosensitive agent for lithography is not required, so that the material cost is reduced; (ii) short time-curing makes it possible to mold a rib in short time, and therefore the high productivity, easier molding, possibility in continuous production and a reduction in steps (maskless, washingless) are achieved; (iii) single irradiation with an energy ray enables curing which is equivalent to or higher than irradiation of several times in a conventional printing method, so that energy saving is achieved, and the running cost is reduced; (iv) expensive facilities such as a lithography and a press are not required, and the facility cost is controlled low; (v) dusts are not produced, and cleanliness is maintained, so that the system contributes to a reduction in waste and is clean and free of dusts; (vi) the accuracy is secured by a die, and scattering in a quality of the product is small, so that the high accuracy is achieved; and (vii) the ideal form going toward the high luminance can be molded by a die, so that the high luminance and the high performance can readily be achieved.

The present invention shall be explained below in further details with reference to examples, but the present invention shall by no means be restricted by these examples.

EXAMPLES

In the composition for a bulkhead, used for powder of glass or ceramic was a mixture comprising the principal components of about 90% by weight of glass powder (principal component: low melting lead glass) and about 10% by weight of ceramic powder (other principal inorganic components comprising zirconium oxide, zirconium silicate, a black pigment for ceramics, if necessary, and the like). Further, in the composition for a bulkhead, compositions shown in Examples 1 to 13 were used for the organic additives (binders) containing the resin compositions.

Example 1

First, prepared as powder of glass or ceramic was a mixture comprising the principal components of about 90% by weight of glass powder (principal component: low melting lead glass) and about 10% by weight of ceramic powder (other principal inorganic components: zirconium oxide, zirconium silicate, a black pigment for ceramics and the like). (A)

Next, blended with 100 parts by weight of Celoxide 2021P (alicyclic epoxy resin; 3,4-cyclohexylmethyl-3,4-epoxycyclohexanecarboxylate, manufactured by Daicel Chemical Co., Ltd.) were 1.75 part by weight of Sun Aid SI-80L (cationic photo•thermopolymerization initiator; Formula (I), manufactured by Sanshin Chemical Co., Ltd.) and 0.75 part by weight of DAICAT 11 (manufactured by Daicel Chemical Co., Ltd.: cationic photopolymerization initiator; aryl base sulfonium salt) to prepare a resin composition for a binder. (B)

Well mixed with 80% by weight of (A) was 20% by weight of (B) to prepare a composition for a bulkhead. (C)

(C) was filled into a die and stuck together with a glass substrate, and then it was irradiated with UV. A metal halide lamp (120 W/cm) was used for a UV lamp and irradiated at a room temperature and an atmospheric pressure in the air. (D)

(D) was completely cured within 5 minutes. After curing, the die was removed, and then (D) was baked (baking temperature: 500 to 650° C.) for about one hour to obtain a good bulkhead.

Example 2

The test was carried out by the same method as in Example 1, except that used as the resin composition of (B) was a resin composition prepared by blending 80 parts by weight of Celoxide 2021P and 20 parts by weight of Celoxide 2000 (photopolymerizable diluent; cyclohexenevinyl monoxide, manufactured by Daicel Chemical Co., Ltd.) with 2.2 parts by weight of Sun Aid SI-80L and 0.8 part by weight of DAICAT 11.

The sample described above was completely cured within 5 minutes. After curing, the die was removed, and then it was baked for about one hour to obtain a good bulkhead.

Example 3

The test was carried out by the same method as in Example 1, except that used as the resin composition of (B) was a resin composition prepared by blending 100 parts by weight of a mixture obtained by adding 0.65 mole of maleic anhydride to 1 mole of Celoxide 2021P to stir and dissolve them with 1.0 part by weight of Irgacure 261 (iron-arene base photopolymerization initiator, manufactured by Ciba Geigy Co., Ltd.) and 1.0 part by weight of Sun Aid SI-60L (cationic photo-thermopolymerization initiator; Formula (I), manufactured by Sanshin Chemical Co., Ltd.).

The sample described above was completely cured within 5 minutes. After curing, the die was removed, and then it was baked for about one hour to obtain a good bulkhead.

Example 4

The test was carried out by the same method as in Example 1, except that used as the resin composition of (B) was a resin composition prepared by blending 100 parts by weight of a mixture obtained by adding 0.65 mole of maleic anhydride to 1 mole of Celoxide 2021P to stir and dissolve them with 0.7 part by weight of DAICAT 11 and 1.8 part by weight of Sun Aid SI-80L.

The sample described above was completely cured within 5 minutes. After curing, the die was removed, and then it was baked for about one hour to obtain a good bulkhead.

Example 5

The test was carried out by the same method as in Example 1, except that used as the resin composition of (B) was a resin composition prepared by blending 100 parts by weight of Celoxide 2021P/maleic anhydride/polyethylene glycol 300 (mole ratio: 1.0/0.65/0.17) with 1.0 part by weight of Irgacure 261 and 1.0 part by weight of Sun Aid SI-60L.

The sample described above was completely cured within 5 minutes. After curing, the die was removed, and then it was baked for about one hour to obtain a good bulkhead.

Example 6

The test was carried out by the same method as in Example 1, except that used as the resin composition of (B) was a resin composition prepared by blending 100 parts by weight of Celoxide 2021P/Celoxide 2000/maleic anhydride/hexahydrophthalic anhydride/polyethylene glycol 300 (mole ratio: 0.95 mol/0.05 mol/0.48 mol/0.16 mol/0.145 mol) with 0.15 part by weight of Irgacure 261, 0.6 part by weight of DAICAT 11 and 1.05 part by weight of Sun Aid SI-60 (cationic photo•thermopolymerization initiator; Formula (I), manufactured by Sanshin Chemical Co., Ltd.).

The sample described above was completely cured within 5 minutes. After curing, the die was removed, and then it was baked for about one hour to obtain a good bulkhead.

Example 7

The test was carried out by the same method as in Example 1, except that used as the resin composition of (B) was a resin composition prepared by blending 100 parts by weight of a mixture obtained by adding 0.65 mole of maleic anhydride to 1 mole of Celoxide 2021P to stir and dissolve them with 1.5 part by weight of Sun Aid SI-60L.

The sample described above was completely cured though requiring longer time than in Example 3. After curing, the die was removed, and then it was baked for about one hour to obtain a good bulkhead.

Example 8

The test was carried out by the same method as in Example 1, except that used as the resin composition of (B) was a resin composition prepared by blending 100 parts by weight of Celoxide 2021P with 1.5 part by weight of Sun Aid SI-80L, 0.5 part by weight of DAICAT 11, 0.5 part by weight of 4,4'-bis[di(β-hydroxyethoxy)phenylsulfonyl] phenylsulfide-bis-hexafluoroantimonate and 0.5 part by weight of 2-butynyltetramethylenesulfonium hexafluoroantimonate.

The sample described above was completely cured within 5 minutes. After curing, the die was removed, and then it was baked for about one hour to obtain a good bulkhead.

Example 9

The test was carried out by the same method as in Example 1, except that used as the resin composition of (B) was a resin composition prepared by blending 100 parts by weight of Celoxide 2021P with 1.5 part by weight of Sun Aid SI-80L, 1.0 part by weight of DAICAT 11 and 0.5 part by weight of phenyltetramethylenesulfonium hexafluoroantimonate.

The sample described above was completely cured within 5 minutes. After curing, the die was removed, and then it was baked for about one hour to obtain a good bulkhead.

Example 10

The test was carried out by the same method as in Example 1, except that before charging a die with the composition for a bulkhead of (C), the composition for a bulkhead was controlled in advance to a temperature range in which curing did not start (60° C. in this example).

The sample described above was completely cured in shorter time than in Example 1. After curing, the die was removed, and then it was baked for about one hour to obtain a good bulkhead.

Example 11

The test was carried out by the same method as in Example 1, except that the resin composition prepared in Example 6 was used to prepare a composition for a bulkhead in the same manner as in (C), and the above composition for a bulkhead was controlled in advance to a temperature range in which curing did not start (40° C. in this example) and then charged into a die.

The sample described above was completely cured in shorter time than in Example 6. After curing, the die was removed, and then it was baked for about one hour to obtain a good bulkhead.

Example 12

The test was carried out by the same method as in Example 1, except that (C) was filled into a die and stuck together with a glass substrate, and then it was put in an oven maintained at 120° C. and heated instead of irradiating it with UV.

The sample described above was completely cured within 10 minutes since starting heating. After curing, the die was removed, and then it was baked for about one hour to obtain a good bulkhead.

Example 13

The test was carried out by the same method as in Example 1, except that the resin composition prepared in Example 6 was used to prepare a composition for a bulkhead in the same manner as in (C), and this was filled into a die and stuck together with a glass substrate, and then it was put in an oven maintained at 120° C. and heated instead of irradiating it with UV.

The sample described above was completely cured within 10 minutes since starting heating. After curing, the die was removed, and then it was baked for about one hour to obtain a good bulkhead.

Comparative Example 1

The test was carried out by the same method as in Example 1, except that a UV-curing resin (RIPOXY LC-630; a vinyl ester resin, manufactured by Showa Kobunshi Co., Ltd.) was used as the resin composition of (B).

The resin composition described above was irradiated with a UV ray for 10 minutes or longer, but only a polar surface on a glass substrate side was cured, and the composition was scarcely cured. Accordingly, when removed from the die, a bulkhead shape which was formed by embossing could not be maintained and was broken or the composition was adhered to a die side. Thus, it was such unsuitable that it did not come to be baked.

Comparative Example 2

The test was carried out by the same method as in Example 1, except that a thermosetting resin (Adeka Optomer KT-960; an alicyclic low viscosity resin, manufactured by Asahi Denka Ind. Co., Ltd.) was used as the resin composition of (B).

The resin composition described above was irradiated with a UV ray for 10 minutes or longer but not cured, and when removed from the die, a bulkhead shape which was formed by embossing could not be maintained and was broken or the composition was adhered to a die side. Thus, it was such unsuitable that it did not come to be baked.

Comparative Example 3

The test was carried out by the same method as in Example 1, except that used as the resin composition of (B) was a resin composition prepared by blending 100 parts by weight of Celoxide 2021P with 2.5 parts by weight of DAICAT 11.

The resin composition described above was irradiated with a UV ray for 10 minutes or longer, but only a polar surface on a glass substrate side was cured, and the composition was scarcely cured. Accordingly, when removed from the die, a bulkhead shape which was formed by embossing could not be maintained and was broken or the composition was adhered to a die side. Thus, it was such unsuitable that it did not come to be baked.

Comparative Example 4

The test was carried out by the same method as in Example 1, except that a resin composition prepared by blending 100 parts by weight of Celoxide 2021P with 1.5 part by weight of Irgacure 261 was used as the resin composition of (B).

The resin composition described above was irradiated with a UV ray for 10 minutes or longer, but only a polar surface on a glass substrate side was cured, and the composition was scarcely cured. Accordingly, when removed from the die, a bulkhead shape which was formed by embossing could not be maintained and was broken or the composition was adhered as well to a die side. Thus, it was such unsuitable that it did not come to be baked.

Comparative Example 5

The test was carried out by the same method as in Example 1, except that used as the resin composition of (B) was a resin composition (composition prepared by removing maleic anhydride from the resin composition prepared in Example 7) prepared by blending 100 parts by weight of Celoxide 2021P with 1.5 part by weight of Sun Aid SI-60L.

The resin composition described above was irradiated with a UV ray for 10 minutes or longer, but only a polar surface on a glass substrate side was cured, and the composition was scarcely cured. Accordingly, when removed from the die, a bulkhead shape which was formed by embossing could not be maintained, and was broken or the composition was adhered to a die side. Thus, it was such unsuitable that it did not come to be baked.

Comparative Example 6

The test was carried out by the same method as in Example 1, except that used as the resin composition of (B) was a resin composition (a composition prepared by removing the photopolymerization initiator component from the resin composition prepared in Example 6) prepared by blending Celoxide 2021P/Celoxide 2000/maleic anhydride/ hexahydrophthalic anhydride/polyethylene glycol 300 (mole ratio: 0.95 mol/0.05 mol/0.48 mol/0.16 mol/0.145 mol).

The resin composition described above was irradiated with a UV ray for 10 minutes or longer but not cured, and when removed from the die, a bulkhead shape which was formed by embossing could not be maintained and was broken or the composition was adhered to a die side. Thus, it was such unsuitable that it did not come to be baked.

That which is claimed is:

1. A composition for a bulkhead of a thin display panel, comprising 85 to 50% by weight of glass or ceramic powder for molding a bulkhead of a thin display panel or apart thereof and 15 to 50% by weight a binder which is an organic additive, wherein said organic additive consists of a resin composition which generates heat energy by in addition with an energy ray and which is cured by energy coming from an energy ray source or the resulting heat energy, said resin composition comprises a photopolymerizable resin component and a photopolymerization initiator system, said photopolymerization resin component being used together with said photopolymerization initiator component to be cured by the energy ray, and said photopolymerization initiator system initiating curing of said photopolymerizable resin component in irradiation with the energy ray, system photopolymerizable resin component being used together with said photopolymerization initiator system to be cured by the energy ray, said photopolymerization initiator system comprises a photo•thermopolymerization initiator which can initiate polymerization by both of light and heat, and said phot•thermopolymerization initiator comprises a sulfonium salt represented by the following general formulae (I), (I') or (II):

wherein $R^6$ represents hydrogen, halogen, a nitro group, or a methyl group; $R^7$ represents hydrogen, $CH_3CO$ or $CH_3OCO$; X represents $SbF_6$, $PF_6$, $AsF_6$, $BF_4$ or $B(C_6F_5)_4$, wherein $R^1$ represents hydrogen, a methyl group, an acetyl group, or a methoxycarbonyl group; $R^2$ and $R^3$ each independently represent hydrogen, halogen, or an alkyl group of $C_1$ to $C_1$; $R^4$ represents hydrogen, halogen or a methoxy group: $R^5$ represents an alkyl group of $C_1$ to $C_4$; and X represents $SbF_6$, $PF_6$, $AsF_6$, $BF_4$ or $B(C_6F_5)_4$.

2. The composition for a bulkhead of a thin display panel as described in claim 1, wherein said resin composition is a resin composition which generates heat energy by irradiation with an energy ray and continuously generates heat energy by the resulting heat energy and which can be cured by energy coming from the energy ray source or the resulting heat energy.

3. The composition for a bulkhead of a thin display panel as described in claim 1 or 2, wherein said heat energy is heat energy generated in the curing reaction.

4. The composition for a bulkhead of a thin display panel as described in claim 1, wherein said photopolymerization initiator component comprises a photo•thermopolymenzation initiator which can initiate polymerization by both light and heat.

5. The composition for a bulkhead of a thin display panel as described in claim 1, wherein said photopolymerization initiator component comprises a photopolymerization initiator comprising a binary or higher system containing a photopolymerization initiator and a photo•thermopolymerization initiator.

6. The composition for a bulkhead of a thin display panel as described in claim 1 or 2, wherein said resin composition comprises a photopolymerizable resin component which can be utilized for curing by irradiation with an energy ray, a photopolymerization initiator component which makes it possible to cure said photopolymerization resin component in irradiation with an energy ray and a curing agent component used for curing at least one of said photopolymerizable resin components by a method other than irradiation with an energy ray.

7. The composition for a bulkhead of a thin display panel as described in claim 6, wherein said resin composition further comprises a curing accelerator component which accelerates curing when curing at least one of the photopolymerizable resin components and the curing agent component described above by a method other than irradiation with an energy ray.

8. The composition for a bulkhead of a thin display panel as described in claim 6, wherein the curing agent component comprises an acid anhydride or a derivative thereof.

9. The composition for a bulkhead of a thin display panel as described in claim 6, wherein the curing agent component comprises monohydric or polyhydric alcohols.

10. The composition for a bulkhead of a thin display panel as described in claim 6, wherein the curing agent component or the curing accelerator component comprises an acid anhydride or a derivative thereof and monohydric or polyhydric alcohols.

11. The composition for a bulkhead of a thin display panel as described in claim 1, wherein the photopolymerizable resin component comprises an epoxy resin component having a cyclic ether structure in a molecular structure.

12. A production process for a bulkhead, comprising molding a bulkhead of a thin display panel is a part thereof with the composition for a bulkhead of a thin display panel as described in claim 1, curing the above molded article and then baking it.

13. The production process for a bulkhead as described in claim 12 wherein the composition for a bulkhead of claim 1 used as the composition for a bulkhead of a thin display panel is heated in advance to such an extent that it is not cured.

* * * * *